United States Patent [19]
Peckham

[11] Patent Number: 5,892,410
[45] Date of Patent: Apr. 6, 1999

[54] METHOD AND APPARATUS FOR TRANSMITTING RADIO FREQUENCY SIGNALS

[75] Inventor: David Sutherland Peckham, Barrington Hills, Ill.

[73] Assignee: Motorola, Inc., Schaumburg, Ill.

[21] Appl. No.: 802,832

[22] Filed: Feb. 19, 1997

[51] Int. Cl.$^6$ .................................................. H03B 5/00
[52] U.S. Cl. .................................. 331/117 R; 331/108 R; 331/179
[58] Field of Search ........................... 331/117 R, 107 R, 331/108 R, 179, 177 R, 187

[56] References Cited

U.S. PATENT DOCUMENTS

| | | | |
|---|---|---|---|
| 4,288,875 | 9/1981 | Carter | 455/197.1 |
| 4,598,423 | 7/1986 | Hettiger | 331/179 X |
| 5,144,264 | 9/1992 | Chong et al. | 331/117 R |
| 5,469,117 | 11/1995 | Phillipe | 331/117 R |
| 5,576,667 | 11/1996 | Gonna | 331/117 D |

*Primary Examiner*—Huan Hoang
*Attorney, Agent, or Firm*—John J. King

[57] ABSTRACT

A transmitter VCO (204) includes nodes for receiving a band selector voltage for altering the base-emitter capactance of a transistor to enable the VCO to act as an oscillator in the appropriate band, and for altering the resonator capacitance to change the resonant frequency of the oscillator. The method and apparatus enables oscillation in different frequency bands for dual mode communication devices.

9 Claims, 2 Drawing Sheets

METHOD AND APPARATUS FOR TRANSMITTING RADIO FREQUENCY SIGNALS

FIELD OF INVENTION

The present invention is generally related to communication devices, and more particularly, to a method and apparatus for transmitting radio frequency signals.

BACKGROUND OF THE INVENTION

With the increased use of wireless communication devices, spectrum has become scarce. In many cases, network operators providing services on one particular band have had to provide service on a separate band to accommodate its customers. For example, network operators providing service on a GSM system in a 900 MHz frequency may have to rely on a DCS system at an 1800 MHz frequency. Accordingly, communication devices, such as cellular radio telephones must be able to communication at both frequencies, or even a third system, such as DCS 1900. Such a requirement to operate at two or more frequencies creates a number of problems. For example, the communication device would have increased size and cost if the transmitter included separate components to transmit signals in each bands.

Accordingly, there is a need for a method and apparatus for transmitting communication signals in a plurality of bands while minimizing the increase in components.

DETAILED DESCRIPTION OF THE INVENTION

Figure 1:
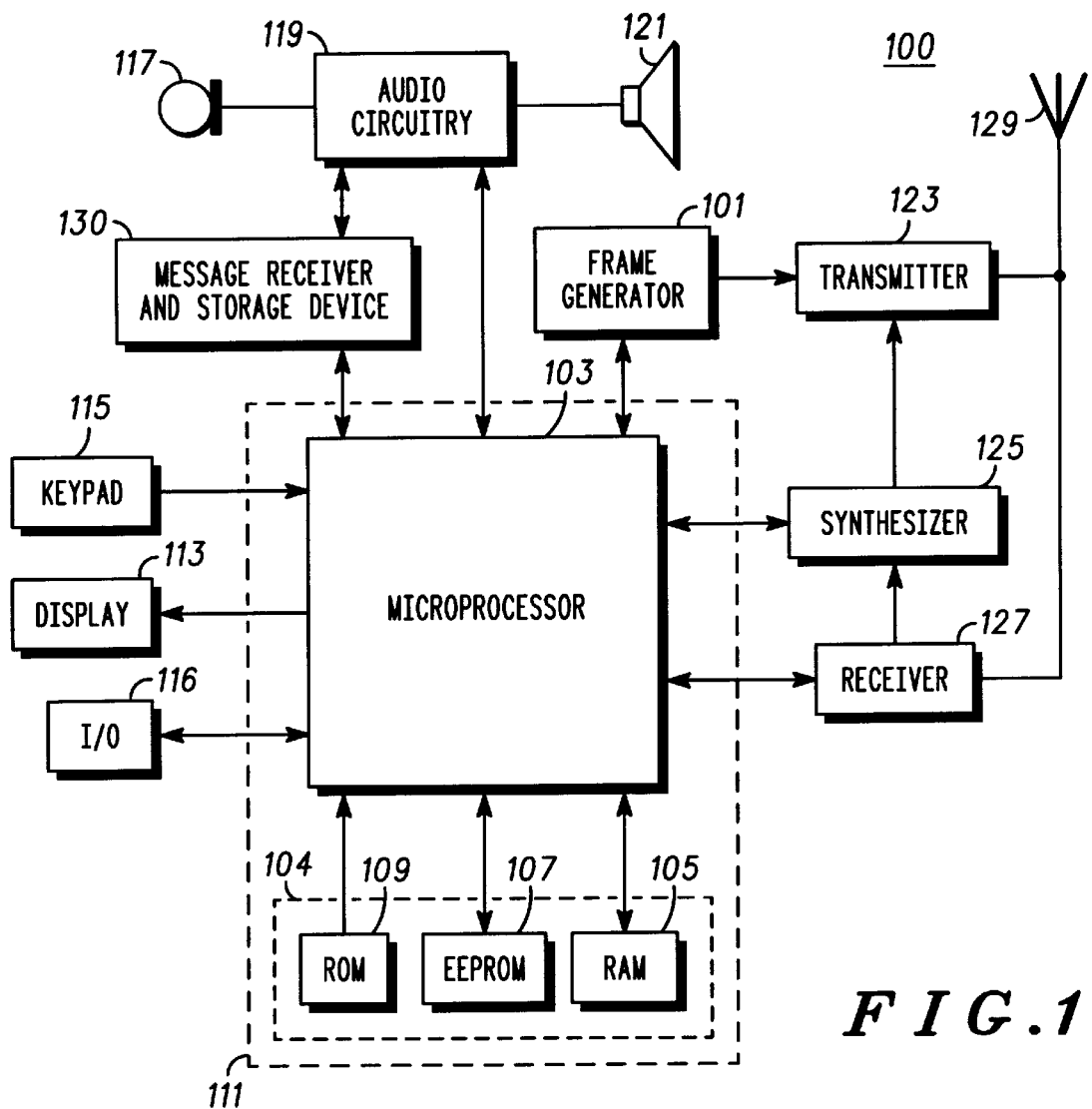
FIG. 1 is block diagram of a communication device according to the present invention.

Turning now to FIG. 1, a block diagram of a wireless communication device such as a cellular radiotelephone incorporating the present invention is shown. In the preferred embodiment, a frame generator ASIC 101, such as a CMOS ASIC available from Motorola, Inc. and a microprocessor 103, such as a 68HC11 microprocessor also available from Motorola, Inc., combine to generate the necessary communication protocol for operating in a cellular system. Microprocessor 103 uses memory 104 comprising RAM 105, EEPROM 107, and ROM 109, preferably consolidated in one package 111, to execute the steps necessary to generate the protocol and to perform other functions for the wireless communication device, such as writing to a display 113, accepting information from a keypad 115, accepting input/output information by way of a connector 116 according to the present invention, controlling a frequency synthesizer 125, or performing steps necessary to amplify a signal according to the method of the present invention. ASIC 101 processes audio transformed by audio circuitry 119 from a microphone 117 and to a speaker 121.

A transceiver processes the radio frequency signals. In particular, a transmitter 123 transmits through an antenna 129 using carrier frequencies produced by a frequency synthesizer 125. Information received by the communication device's antenna 129 enters receiver 127 which demodulates the symbols using the carrier frequencies from frequency synthesizer 125. The communication device may optionally include a message receiver and storage device 130 including digital signal processing means. The message receiver and storage device could be, for example, a digital answering machine or a paging receiver.

Figure 2:
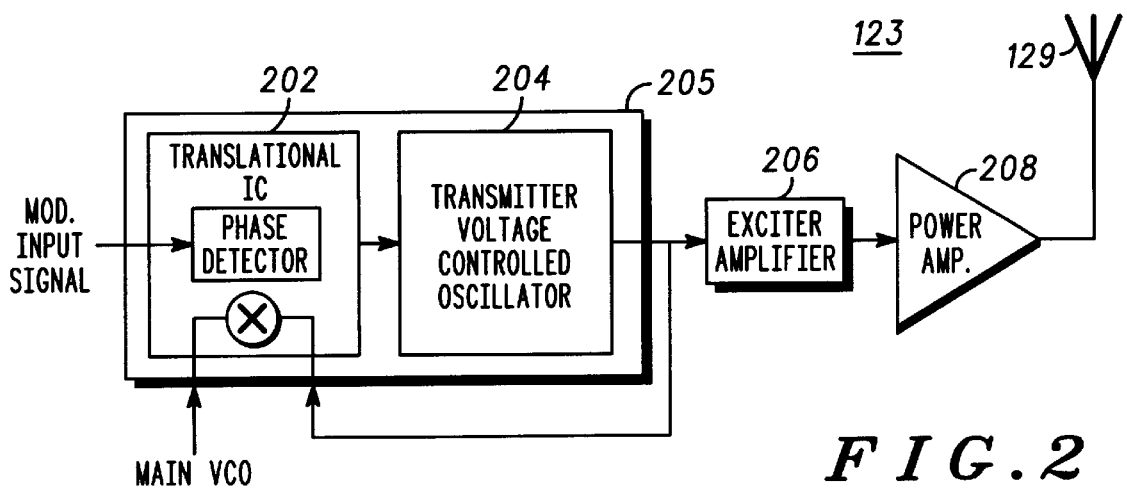
FIG. 2 is a block diagram of transmitter 123 of FIG. 1 according to the present invention.

Turning now to FIG. 2, transmitter circuit 123 of FIG. 1 is shown. In particular, a translational IC 202 and a transmitter voltage controlled oscillator (VCO) form a modulator 205. Translational IC provides a phase lock loop for the transmitter circuit. Translational IC 202 receives a modulated input signal from an offset VCO and a main VCO. As will be described in more detail in reference to FIG. 3, translational IC 202 provides an output voltage (or steering voltage) which controls transmitter VCO 204. The output of transmitter voltage controlled oscillator is provided to an exciter amplifier 206 which supplies drive to power amplifier 208. The output of transmitter voltage control oscillator is also fed back to translational IC 202.

Figure 3:
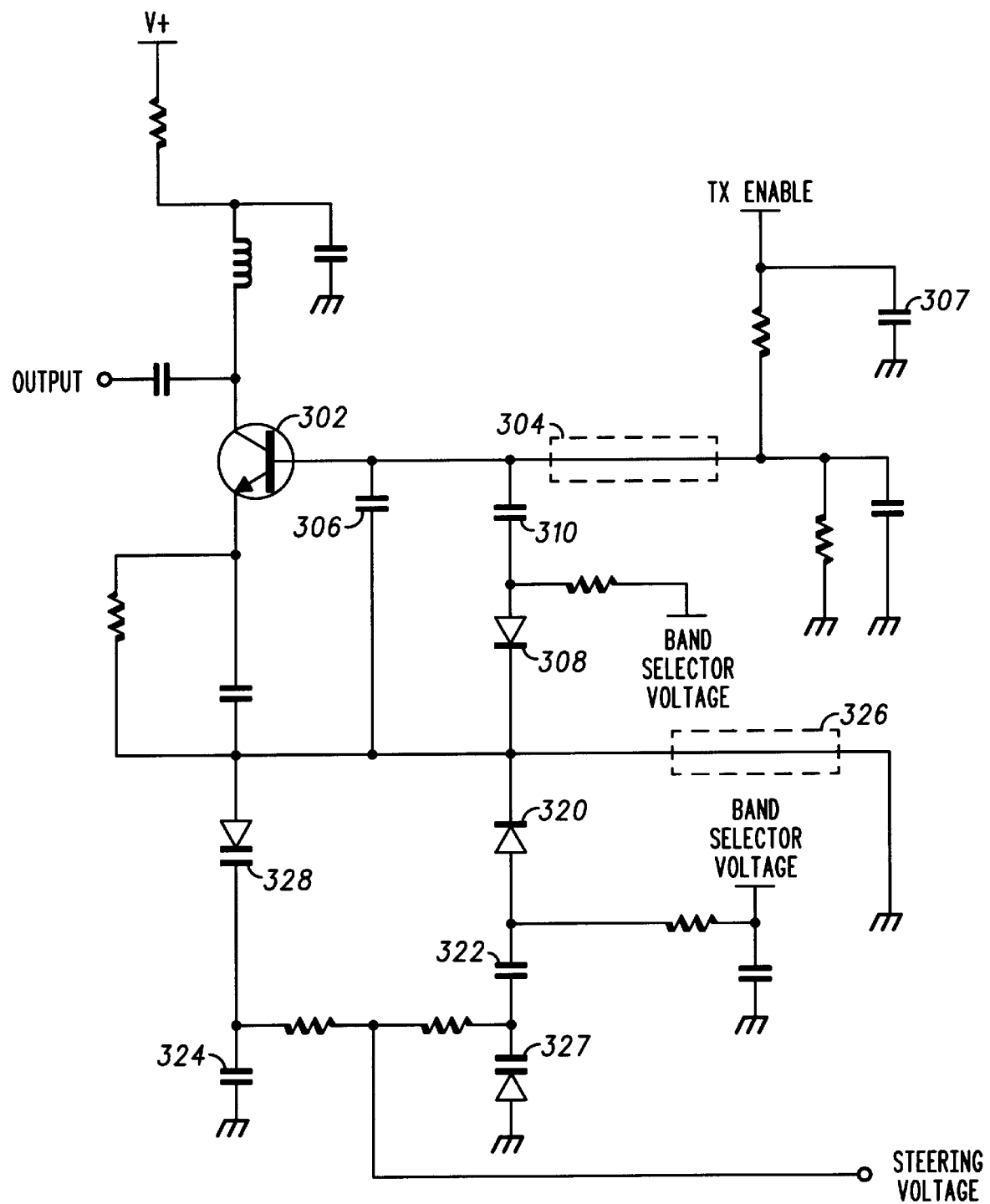
FIG. 3 is circuit diagram of a transmitter voltage controlled oscillator 204 according to the present invention.

Turning now to FIG. 3, a circuit diagram shows a transmitter voltage control oscillator 204 according to the present invention. The transmitter VCO includes nodes for receiving a band selector voltage, preferably provided by microprocessor 103, for altering the base-emitter capacitance to enable the amplifier to act as an oscillator in the appropriate band, and for altering the resonator capacitance to change the resonant frequency of the oscillator. In particular, an inductor, such as strip line inductor 304, is coupled to a capacitor 306 at the base of the transistor 302. The values of inductor 304 and capacitor 306 are selected to enable transistor 302 to oscillate in a particular frequency band. For example, inductor is preferably 0.2 mm wide and 5 mm long, while capacitor 306 is preferably 0.75 pf. With a zero or negative band selector voltage, diode 308 remains unbiased, isolating capacitor 310 and enabling oscillation in the DCS 1800 MHz band.

When the transmitter VCO is to oscillate at a frequency in another band, band selector voltage is changed to bias diode 308. By applying a positive band selector voltage, diode 308 is turned on, thereby coupling capacitor 310, which is preferably 5.6 pf, in parallel with capacitor 306. Accordingly, the capacitance of base-emitter feedback path is now determined by inductor 304 and parallel capacitors 306 and 310. Because of the change in capacitance created by the parallel capacitors, the transistor oscillates in the GSM 900 MHz band.

Similarly, a band selector voltage is coupled to a second diode 320 to alter the resonant frequency of the oscillator by coupling/decoupling a second capacitor 322 in parallel with capacitor 324 in series with variable capacitor 328. For DCS 1800 MHz operation, a zero or negative band selector voltage will not bias on diode 320. Because capacitor 322 will be isolated, the resonant frequency of the oscillator is determined by inductor 326 and the capacitance of series capacitor 324 and variable capacitor 328. With a microstrip inductor 326 having a width of 0.2 mm and a length of 4 mm, and capacitor values of 5.6 pf for capacitor 324 and approximately 4 pf for variable capacitor 328, the transistor will oscillate in the 1800 MHz band, depending upon the steering voltage.

For GSM 900 MHz operation, a positive band selector voltage biases diode 320 on. Therefore, the resonant frequency is determined by inductor 326 and the capacitance of series capacitors 322 and 327 in parallel with series capacitor 324 and variable capacitor 328. With a capacitance of 15 pf for variable capacitor 327 and 10 pf for capacitor 322, the transistor will oscillate in the GSM 900 MHz band. Finally, a steering voltage is applied to variable voltage capacitors 327 and 328 to vary the resonant frequency within the selected band.

Although the invention has been described and illustrated in the above description and drawings, it is understood that this description is given by way of example only and that numerous changes and modifications can be made by those skilled in the art without departing from the true spirit and scope of the invention. Although the present invention finds particular application in portable cellular radiotelephones, the invention could be applied to any portable device, including pagers, electronic organizers, or computers. My invention should be limited only by the following claims.

I claim:

1. A voltage controlled oscillator comprising:

a transistor for generating a resonating output signal, said transistor having a base, a collector and an emitter;

a first inductor and a first capacitor coupled to said base of said transistor;

a first control node coupled to receive a band selector voltage, said band selector voltage coupling a second capacitor to said base-emitter for altering the band of said resonating output signal; and a second control node coupled to receive said band selector voltage for coupling a third capacitor to the emitter for altering said resonating output signal.

2. The voltage controlled oscillator of claim 1 wherein said second capacitor is coupled in parallel with said first capacitor.

3. The voltage controlled oscillator of claim 2 wherein said band of said output signal is determined by said first inductor, said first capacitor and said second capacitor.

4. The voltage controlled oscillator of claim 3 further comprising a fourth capacitor coupled to a second inductor and coupled to said third capacitor.

5. The voltage controlled oscillator of claim 4 wherein said resonating output signal is determined by said third capacitor, said fourth capacitor and said second inductor.

6. A method of generating a variable oscillating output signal, said method comprising the steps of:

generating an oscillating output signal;

receiving a first band selector voltage;

coupling a first capacitor to a base of a transistor for altering the frequency band of said oscillating output signal in response to said first band selector voltage; and coupling a second capacitor to said emitter for altering the frequency of oscillation of said oscillating output signal.

7. The method of generating a variable oscillating output signal of claim 6 further comprising a step of receiving a second band selector voltage.

8. The method of generating a variable oscillating output signal of claim 7 further comprising a step of decoupling said first capacitor in response to said second band selector voltage.

9. The method of generating a variable oscillating output signal of claim 8 further comprising a step of decoupling said second capacitor in response to said second band selector voltage.

* * * * *